(12) United States Patent
Shinjo et al.

(10) Patent No.: US 6,326,779 B1
(45) Date of Patent: Dec. 4, 2001

(54) MAGNETIC DETECTOR HAVING SEPARATE BASE AND CONNECTOR UNITS AND PRODUCTION PROCESS THEREFOR

(75) Inventors: Izuru Shinjo; Takuji Nada; Yasuyoshi Hatazawa; Naoki Hiraoka, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/172,079

(22) Filed: Oct. 14, 1998

(30) Foreign Application Priority Data

Apr. 23, 1998 (JP) .................................................. 10-113893

(51) Int. Cl.$^7$ ....................................................... G01B 7/30
(52) U.S. Cl. .................................. 324/207.21; 324/207.25
(58) Field of Search ............................. 324/207.2, 207.21, 324/207.22, 207.23, 207.24, 207.25, 252, 174, 166, 173; 338/32 R, 32 H

(56) References Cited

U.S. PATENT DOCUMENTS

| 5,559,433 | * | 9/1996 | Onizuka | 324/207.21 |
| 5,631,556 | * | 5/1997 | Shibata | 324/174 |
| 5,637,995 | * | 6/1997 | Izawa et al. | 327/174 |
| 5,801,529 | * | 9/1998 | Umemoto et al. | 324/207.12 |
| 5,821,744 | * | 10/1998 | Shinjo et al. | 324/207.2 |
| 5,929,629 | * | 7/1999 | Hiraoka et al. | 324/174 |

FOREIGN PATENT DOCUMENTS

| 40 05 478 C2 | 11/1992 | (DE) . |
| 44 36 875 A1 | 4/1996 | (DE) . |
| 195 23 322 A1 | 1/1997 | (DE) . |
| 196 47 320 A1 | 12/1997 | (DE) . |
| 7-260813 | 10/1995 | (JP) . |
| 8-201016 | 8/1996 | (JP) . |

* cited by examiner

Primary Examiner—Jay Patidar
(74) Attorney, Agent, or Firm—Sughrue, Mion, Zinn, Macpeak & Seas, PLLC

(57) ABSTRACT

A magnetic detector having high productivity is provided by producing a connector and a base as separate units, electrically interconnecting them, forming a cut-out portion in a press-in portion of the base, and injecting a thermosetting resin adhesive into a whole case. The case also has a recess portion that prevents excess injected resin from leaking to the outside of the case. The structure of the base also allows for easier injection of resin and simplified connection of the magnetic resistance element to the base.

8 Claims, 9 Drawing Sheets

MAGNETIC DETECTOR HAVING SEPARATE BASE AND CONNECTOR UNITS AND PRODUCTION PROCESS THEREFOR

BACKGROUND OF THE INVENTION

1. [Field of the Invention]

The present invention relates to a magnetic detector for detecting a magnetic field and, more specifically, to a magnetic apparatus for detecting changes in magnetic field caused by the rotation of a magnetic material or the like and to a production process therefor.

2. [Description of the Prior Art]

FIGS. 8(a) and 8(b) are structural diagrams of a magnetic detector of the prior art, FIG. 8(a) is a top view and FIG. 8(b) is a sectional view taken on line A—A of FIG. 8(a). This magnetic detector comprises a magnetic resistance element for detecting a magnetic field (to be referred to as "MR element" hereinafter), a magnet 2 for providing a bias magnetic field to the MR element 1, a protection circuit 4 composed of a plurality of electronic parts 3 for removing external noise from the output waveform of the MR element 1, a lead frame 5 for mounting the electronic parts 3, a base 6 for holding the MR element 1, the magnet 2 and the lead frame 5, a case 7 for protecting the base 6, and a connector 8, integrated with the base 6, for outputting the output signal of the MR element 1 to the outside.

The base 6 is insert molded together with the magnet 2 after the electronic parts 3 forming the protection circuit 4 are mounted on the lead frame 5, and the MR element 1 is soldered to an element attachment portion 5k of the lead frame 5 exposed on the base 6 integrated with the connector 8 after the formation of the base 6.

After the attachment of the MR element 1, the base 6 is press fitted in a press-in hole 7k of the case 7 and fixed at a press-in portion 6k formed at an upper portion (left side of FIG. 8(b)) of the base 6. Liquid packing P is coated on the outer periphery of the press-in portion 6k to cover up tight an inside portion 7s of the case 7. Further, to fix the base 6 to the case 7 firmly, an upper portion of the case 7 is filled with a thermosetting resin adhesive 9 (shown by slant lines of FIG. 8(b)).

As shown in FIG. 9, the MR element 1 has a thin film magnetic resistance pattern 1b made from a magnetic material having a large magnetic resistance effect, such as permalloy, formed on the substrate 1a made from ceramic or the like. The resistance value of the magnetic resistance pattern 1b changes according to the size of a magnetic field applied to the magnetic resistance pattern 1b. Then, the MR element 1 is arranged next to a magnetic rotor 50 having an irregular surface on the outer periphery and rotating around a rotation axis J with predetermined spacing therebetween to detect changes in the strength of a magnetic field it receives from the magnetic rotor 50, whereby the rotation position or rotation speed of the magnetic rotor 50 can be obtained.

However, in the above magnetic detector of the prior art, since the connector 8 and the base 6 are integrated with each other, the shape of the magnetic detector is complex and the production cost of a mold used to produce the magnetic detector is high. In addition, when the shape of the connector 8 or the position of the connector 8 with respect to the case 7 is changed, a mold for producing the base 6 and the connector 8 integrally must be newly fabricated, thereby further boosting equipment costs.

When the base 6 is to be press fitted in the case 7, since the inside of the case 7 is empty and the base 6 is covered up tight in the case 7, the liquid packing P must be coated on the outer periphery of the press-in portion 6k to protect the MR element 1 in the case from moisture, dust and the like. Thereby, productivity deteriorates and costs rise.

Further, when the thermosetting resin adhesive 9 is to be injected into the upper portion of the case 7, the resin adhesive 9 often overflows from the case 7 and adheres to the side surface of the case 7. Therefore, a checking step must be provided to remove the adhered resin adhesive 9, thereby boosting the production cost.

To improve the characteristic properties of the magnetic detector, the MR element 1 must be arranged in front of the magnet 2. However, as the MR element 1 and the base for holding the magnet 2 are produced as separate units, the MR element 1 must be soldered to the lead frame 5 exposed on the base 6 while it is located at a predetermined position in front of the magnet 2, thereby reducing productivity and boosting costs.

Moreover, as shown in FIGS. 10(a) and 10(b), solder S for mounting electronic parts 3 (shown by slant lines in FIG. 10(b)) previously coated on a land portion 5a of the lead frame 5 may flow away at the time of soldering the electronic parts 3, thereby reducing the reliability of the apparatus. For comparison, the shape of the lead frame 5 of FIGS. 10(a) and 10(b) is made similar to that of the lead frame of the present invention which will be described hereinafter.

SUMMARY OF THE INVENTION

The present invention has been made to solve the above problems and it is an object of the present invention to provide a low-cost magnetic detector having high productivity and high reliability.

According to a first aspect of the present invention, there is provided a process for producing a magnetic detector which comprises the steps of:

producing a base for holding a magnetic detection element for detecting a magnetic field and a connector for outputting the output signal of the magnetic detection element to the outside as separate units; and electrically interconnecting the magnetic detection element and the connector.

According to a second aspect of the present invention, there is provided a magnetic detector comprising:

a base for holding a magnetic detection element;

a case for housing the base; and a connector, produced as a separate unit from the base and having a connection portion with the base, for outputting the output signal of the magnetic detection element to the outside.

According to a third aspect of the present invention, there is provided a magnetic detector, wherein a resin is injected into the case.

According to a fourth aspect of the present invention, there is provided a magnetic detector, wherein a press-in hole for press fitting the base is formed in the case and a cut-out portion or a through hole for injecting the resin is formed in the press-in portion of the base.

According to a fifth aspect of the present invention, there is provided a magnetic detector, wherein a tapered portion is formed in an uneven portion of the base.

According to a sixth aspect of the present invention, there is provided a magnetic detector, wherein a recess is formed near an opening portion of the case.

According to a seventh aspect of the present invention, there is provided a magnetic detector, wherein a cut-out is formed between the opening portion of the case and the recess.

According to an eighth aspect of the present invention, there is provided a magnetic detector, wherein the base is constructed such that the resin forming the base does not exist between the magnetic detection element and the output terminal of the magnetic detection element.

According to a ninth aspect of the present invention, there is provided a magnetic detector, wherein a land portion of the lead frame is made double-structured by forming a bent portion connected to the land portion and placing it upon the land portion.

According to a tenth aspect of the present invention, there is provided a magnetic detector, wherein a metal having high solder wettability is adhered to the land portion of the lead frame.

According to an eleventh aspect of the present invention, there is provided a magnetic detector, wherein an area having lower solder wettability than the land portion is formed around the land portion of the lead frame.

According to an eleventh aspect of the present invention, there is provided a magnetic detector, wherein the area having low solder wettability is formed by a resist material.

The above and other objects, features and advantages of the invention will become more apparent from the following description when taken in conjunction with the accompanying drawings.

BRIEF DESCRIPTION OF THE ACCOMPANYING DRAWINGS

FIGS. 1(*a*) and 1(*b*) are structural diagrams of a magnetic detector according to Embodiment 1 of the present invention;

FIGS. 2(*a*) to 2(*c*) are diagrams of a base according to Embodiment 1 of the present invention;

FIGS. 3(*a*) and 3(*b*) are diagrams of a base molded of a resin according to Embodiment 1 of the present invention;

FIGS. 4(*a*) and 4(*b*) are diagrams of a case according to Embodiment 1 of the present invention;

FIGS. 5(*a*) to 5(*c*) are diagrams of a lead frame according to Embodiment 1 of the present invention;

Figure 8A:
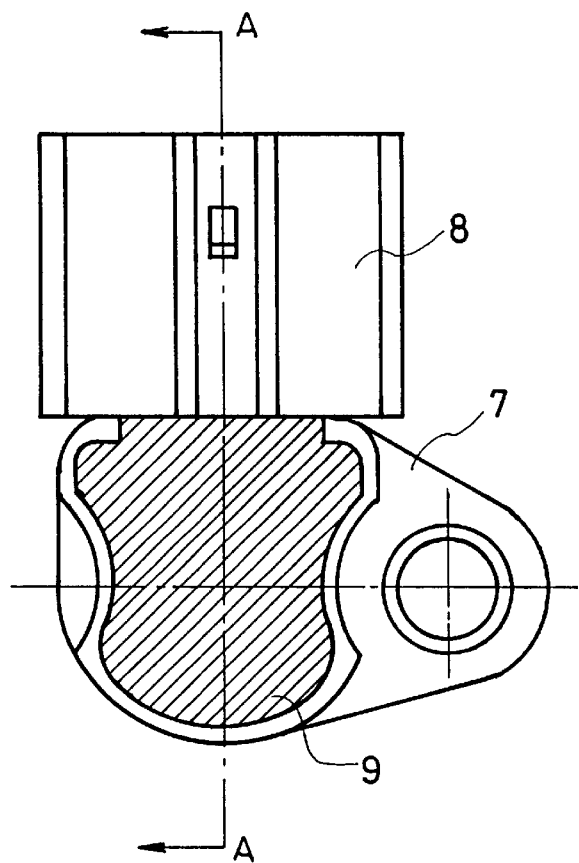
Figure 8B:
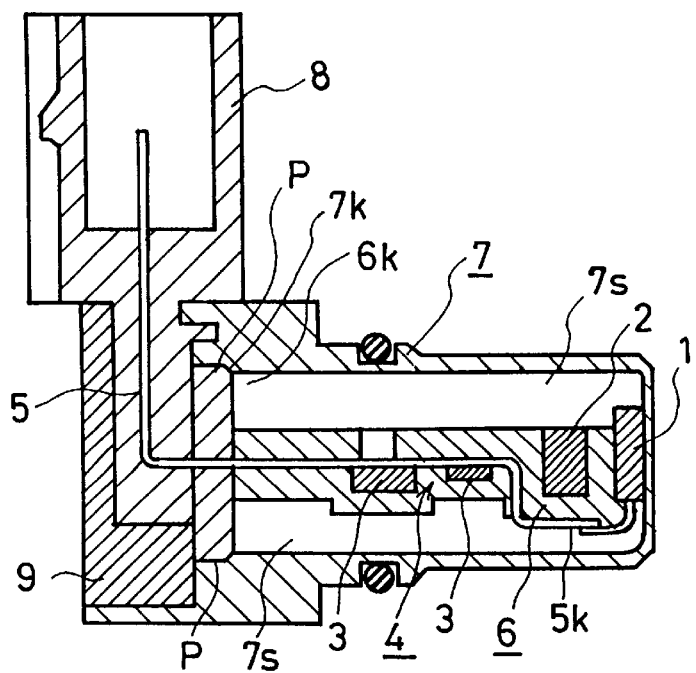
Figure 9:
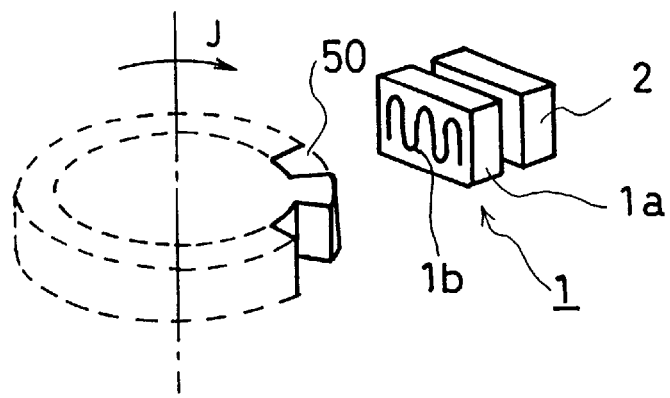
Figure 10A:
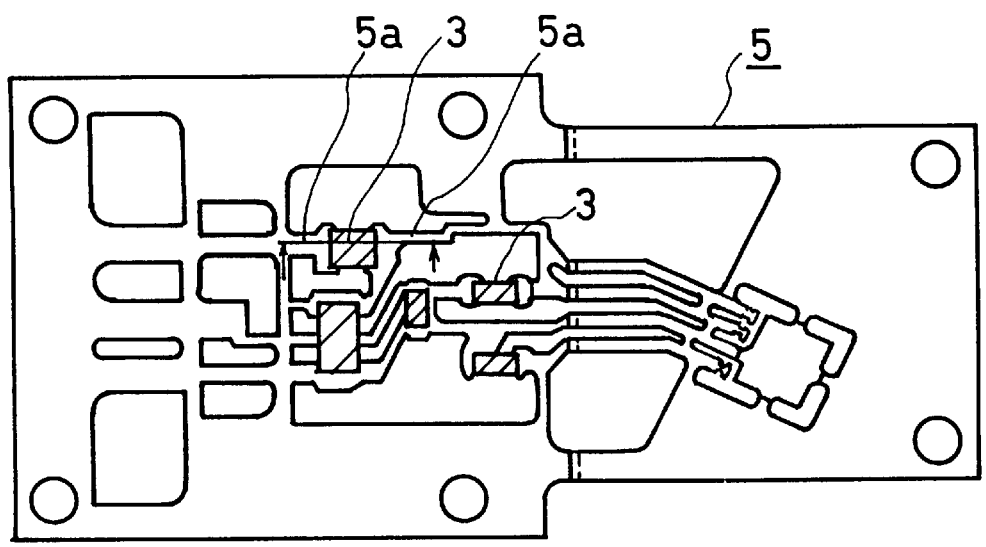
Figure 10B:
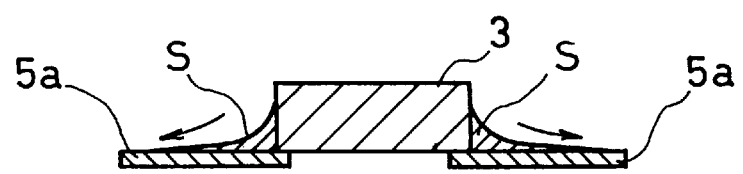

FIGS. 8(*a*) and 8(*b*) are diagrams of a magnetic detector of the prior art;

FIG. 9 is a diagram for explaining the magnetic field detection method of an MR element; and FIGS. 10(*a*) and (*b*) are diagrams of the lead frame of the magnetic detector of the prior art.

DETAILED DESCRIPTION OF THE PREFERRED EMBODIMENTS

Preferred embodiments of the present invention will be described hereinunder with reference to the accompanying drawings.

In the following description, the same or corresponding elements as those in the prior art are given the same reference symbols.

Embodiment 1

Figure 1A:
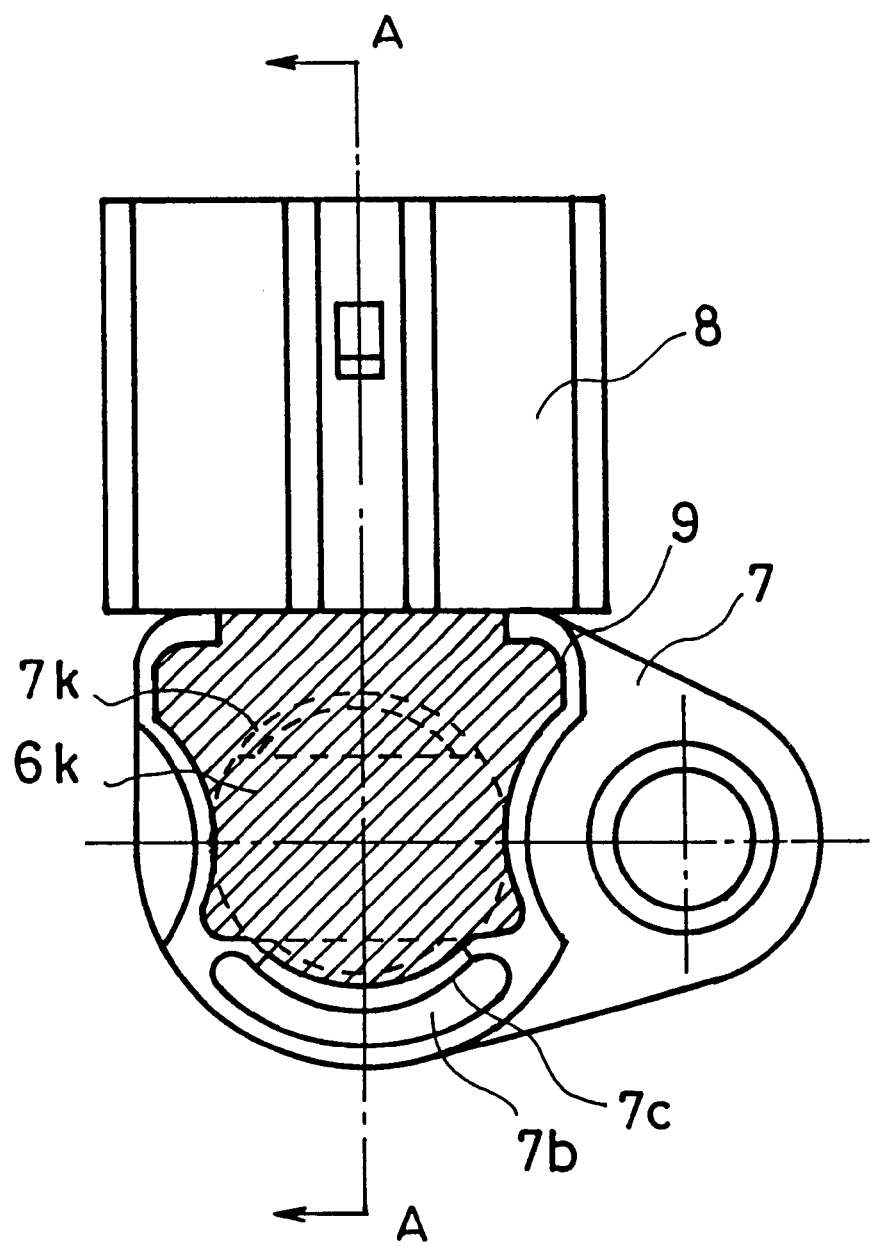
Figure 1B:
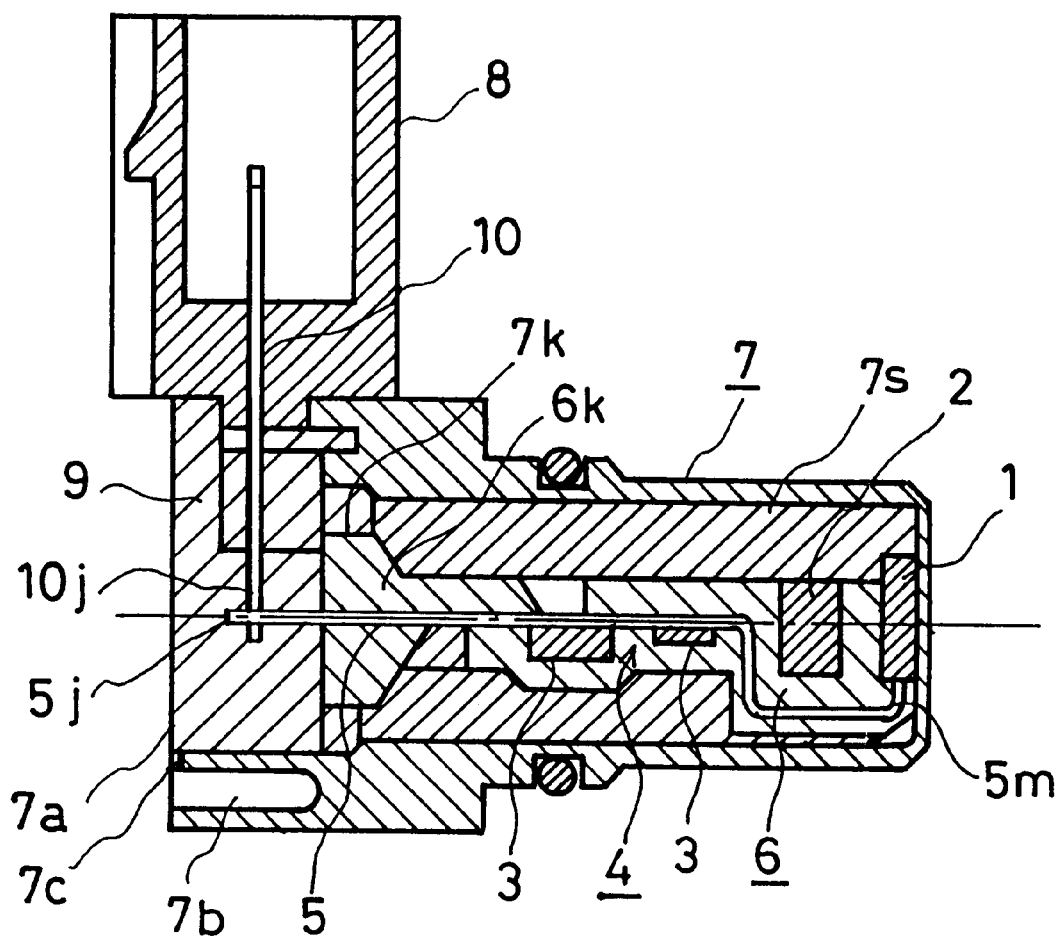

FIGS. 1(*a*) and 1(*b*) are diagrams showing the configuration of a magnetic detector according to Embodiment 1 of the present invention. FIG. 1(*a*) is a top view and FIG. 1(*b*) is a sectional view taken on line A—A of FIG. 1(*a*). In FIGS. 1(*a*) and 1(*b*), reference numeral 1 denotes a magnetic resistance element (to be referred to as "MR element" hereinafter) for detecting a magnetic field, 2 a magnet for providing a bias magnetic field to the MR element 1, 4 a protection circuit composed of a plurality of electronic parts 3 for removing external noise from the output waveform of the MR element 1, 5 a lead frame for mounting the electronic parts 3, 6 a base for holding the MR element, the magnet 2 and the lead frame 5, 7 a case for protecting the base 6, 8 a connector, produced separately from the base 6, for outputting the output signal of the MR element 1 to the outside, and 9 a thermosetting resin adhesive filled inside the case 7. The connector 8 has an insert conductor 10 for electrically interconnecting the lead frame 5 held by the base and the connector 8. The insert conductor 10 corresponds to a connection portion between the connector 8 and the base 6.

In FIGS. 1(*a*) and 1(*b*), reference symbol 7*b* represents a recess formed in an opening portion 7*a* of the case 7 and 7*c* is a cut-out portion. Denoted by 7*k* is a cylindrical press-in hole formed in the case 7 and 6*k* is a press-in portion formed in an upper end portion of the base 6.

The MR element 1 is connected to an output terminal portion 5*m* for the MR element 1 formed at a lower end (right side of FIG. 1(*b*)) of the lead frame 5, and one end 10*j* of the insert conductor 10 of the connector 8 is soldered to an end portion 5*j* on a (upper) side opposite to the MR element 1 of the lead frame 5 for electrical interconnection.

Since the connector 8 is produced separately from the base 6, the shape of the connector 8 can be simplified and accordingly, the connector 8 can be produced using a inexpensive mold when the shape of the connector 8 or the installation position of the connector 8 must be changed.

Figure 2A:
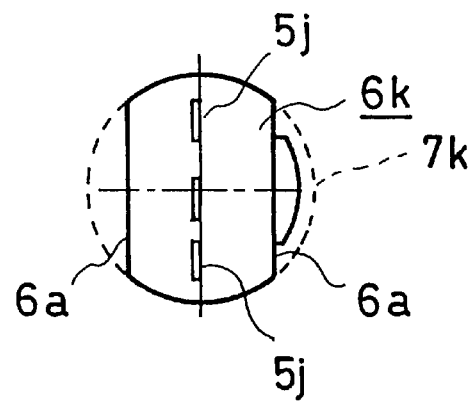
Figure 2B:
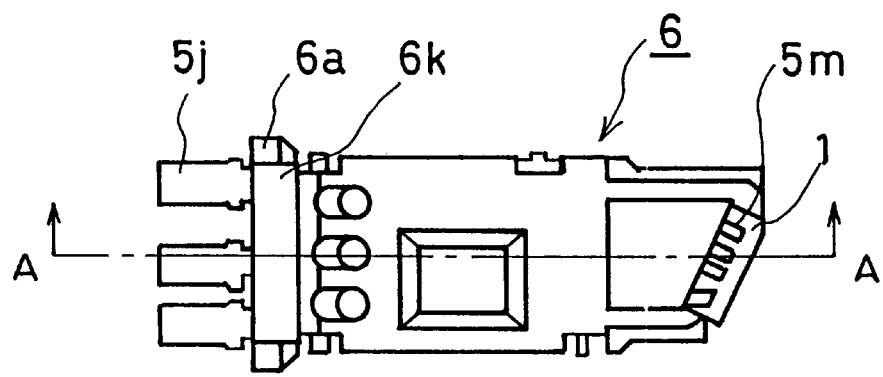
Figure 2C:
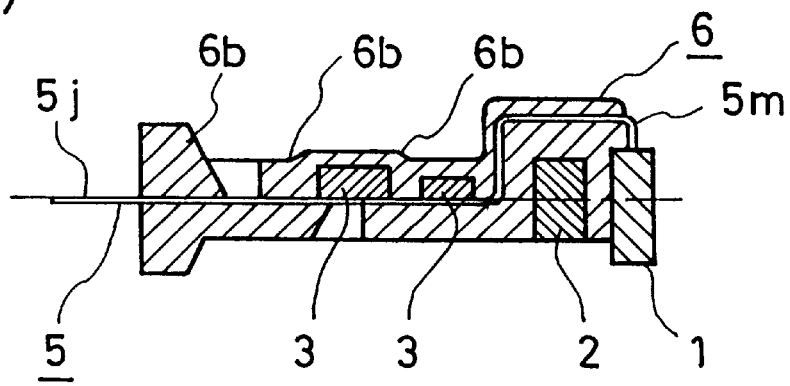

FIGS. 2(*a*) to 2(*c*) are diagrams showing the configuration of the base 6. FIG. 2(*a*) is a side view, FIG. 2(*b*) is a plan view, and FIG. 2(*c*) is a sectional view taken on line A—A of FIG. 2(*b*).

As shown in FIG. 2(*a*), a cut-out portion 6*a* for inserting a nozzle for injecting the thermosetting resin adhesive 9 into a gap between the case 7 and the base 6 in the case 7 is formed in both sides of the press-in portion 6*k* press fitted in and fixed to the press-in hole 7*k* of the case 7 so that when the base 6 is press-fitted in the case 7, the nozzle is inserted into the case 7 to inject the resin adhesive 9 from a bottom portion of the case 7 (see FIG. 1(*b*)). As shown in FIG. 2(*c*), a tapered portion is formed in an uneven portion 6*b* of the base 6 so that air in the case 7 can escape easily to suppress the generation of a void when the resin adhesive 9 is injected. Since the thermosetting resin adhesive 9 is injected into the whole case 7, the MR element 1 can be protected from moisture, dust and the like without coating liquid packing P unlike the prior art. A through hole for inserting the nozzle into the press-in portion 6*k* may be formed in place of the cut-out portion 6*a* to inject the resin adhesive 9.

Figure 3A:
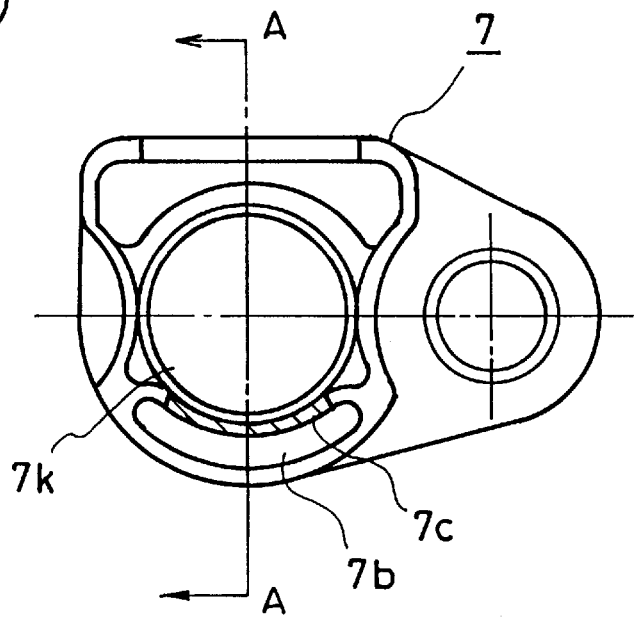
Figure 3B:
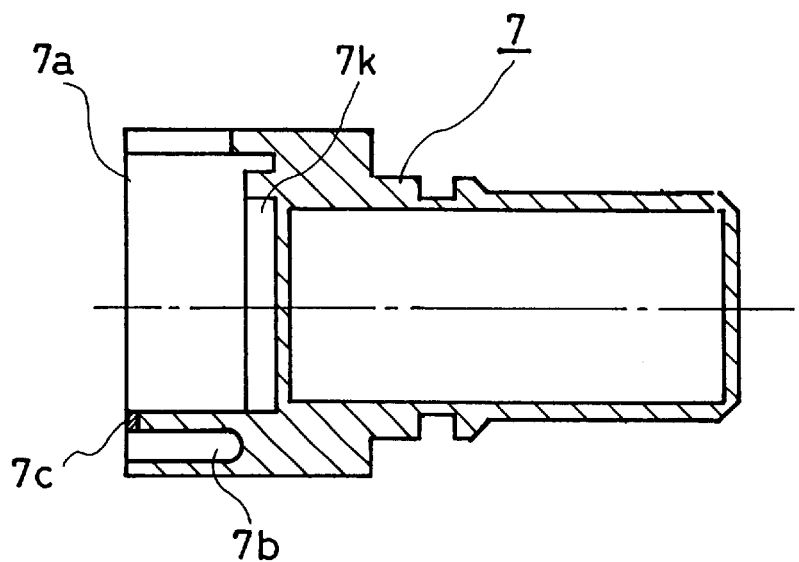

To prevent the thermosetting resin adhesive 9 from overflowing and adhering to the side surface of the case 7, as shown in FIGS. 3(*a*) and 3(*b*), a recess 7*b* is formed near the opening portion 7*a* of the case 7 and a cut-out 7*c* (shown by slant lines in FIGS. 4(*a*) and 4(*b*) is formed between the recess 7*b* and the opening portion 7*a*. That is, when the resin adhesive 9 overflows from the opening portion 7*a*, the resin adhesive 9 is guided fro mthe cut-out 7*c* to the recess 7*b* and stored in the recess 7*b*, thereby preventing the resin adhesive 9 from adhering to the side surface of the case 7.

To prevent the thermosetting resin adhesive 9 from overflowing and adhering to the side surface of the case 7, as shown in FIGS. 3(*a*) and 3(*b*), a recess 7*b* is formed near the opening portion 7*a* of the case 7 and a cut-out 7*c* (shown by slant lines in FIGS. 4(*a*) and 4(*b*)) is formed between the recess 7b and the opening portion 7a. That is, when the resin adhesive 9 overflows from the opening portion 7a, the resin adhesive 9 is guided from the cut-out 7c to the recess 7c and stored in the recess 7c, thereby preventing the resin adhesive 9 from adhering to the side surface of the case 7.

Figure 4A:
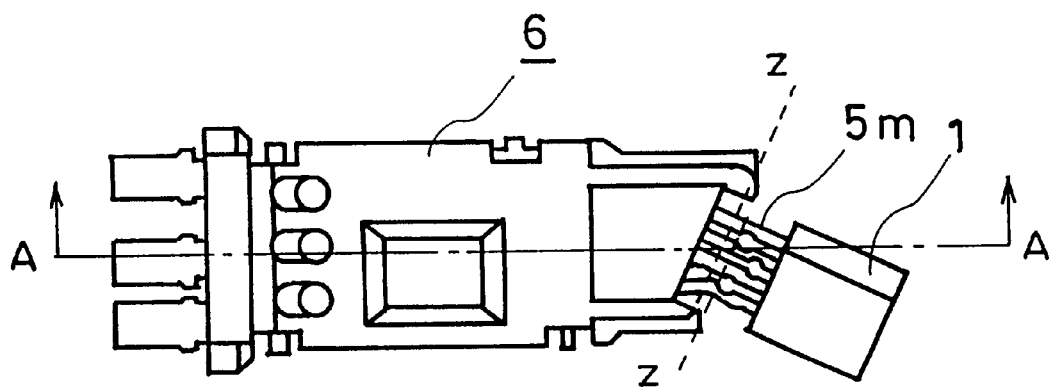
Figure 4B:
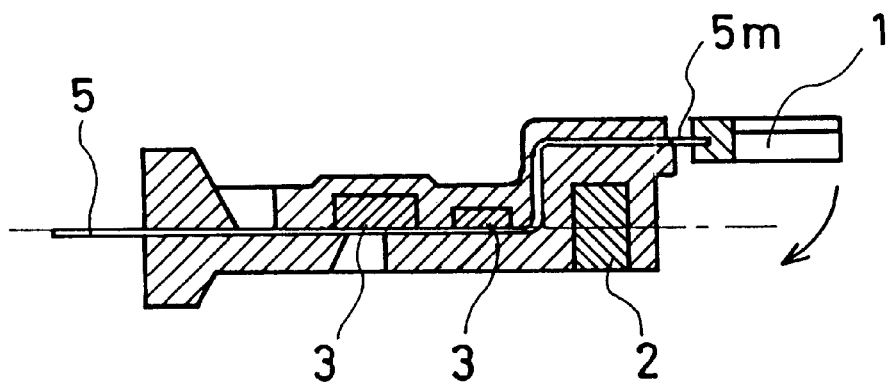

FIG. 4(a) is a plan view of the base 6 before the MR element 1 is bent, and FIG. 4(b) is a sectional view taken on line A—A of FIG. 4(a). Before the base 6 is molded of a thermosetting resin, the MR element 1 and the lead frame 5 are interconnected by an unshown wire, the MR element 1 and the output terminal portion 5m for the MR element 1 formed in the lead frame 5 are molded into one piece in such a manner that they are projected from the base 6, and an area devoid of the resin is formed between a portion where the magnet 2 is formed and a portion where the MR element 1 is formed of the base 6. Since the MR element 1 is integrated with the base 6, it can be arranged in front of the magnet 2 by bending the output terminal portion 5m of the lead frame 5 at a predetermined position (for example, line z—z in FIG. 4(a)) after the base 6 is molded. Therefore, the operation of soldering the MR element 1 to the lead frame 5 is eliminated and the MR element 1 can be arranged at a predetermined position easily.

Figure 5A:
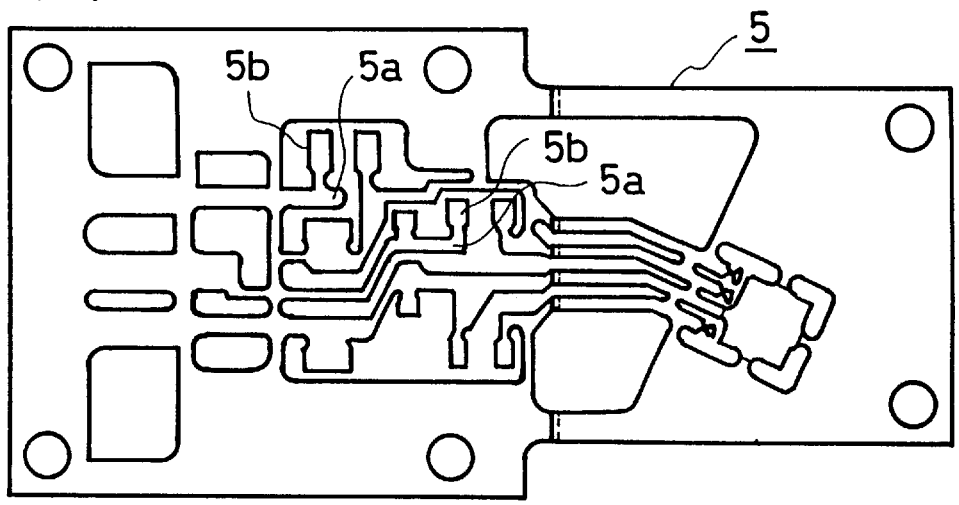
Figure 5B:
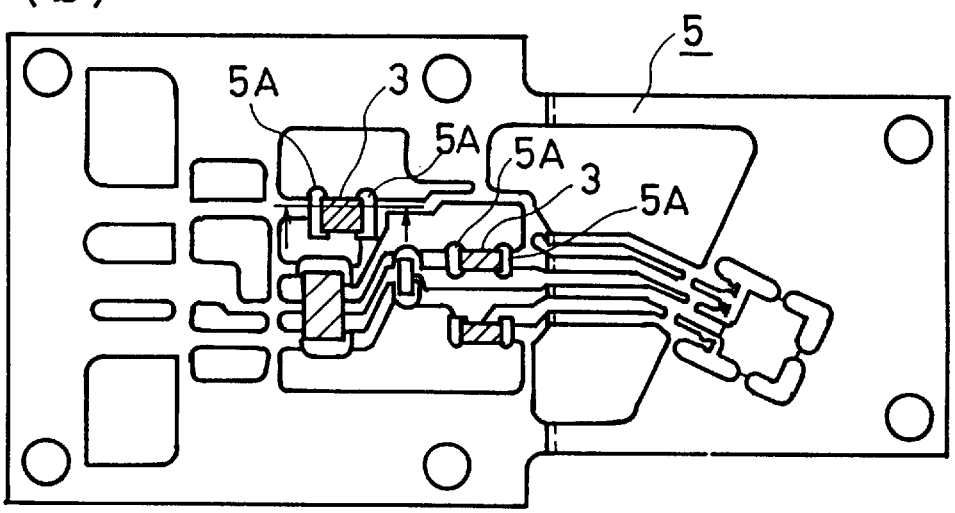
Figure 5C:
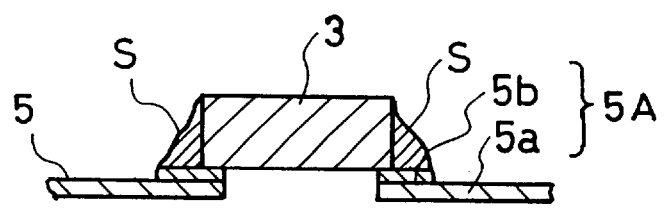

FIGS. 5(a) to 5(c) are diagrams showing the configuration of the lead frame 5. FIG. 5(a) is a plan view of the lead frame 5 before the electronic parts 3 are mounted, FIG. 5(b) is a plan view after the electronic parts 3 are mounted, and FIG. 5(c) is a partial side view after the electronic parts 3 are mounted. To mount the electronic parts 3 on the lead frame 5, a double-structured land portion 5A in which a bent portion 5b connected to a land portion 5a is placed upon the land portion 5a is formed and then soldering is carried out. That is, since there is a level difference between the land portion 5A for mounting the electronic parts 3 and a portion therearound, solder does not flow away due to its surface tension.

According to this Embodiment 1, since the connector 8 and the base 6 are formed as separate units, when the connector must be changed, the connector 8 can be formed by producing an inexpensive mold having a simple shape, thereby making it possible to reduce the production cost thereof.

Further, since the thermosetting resin adhesive 9 is injected into the whole case 7, the need for coating liquid packing P is eliminated and the cut-out portion 6a is formed in the press-in portion 6k of the base 6 to enable the nozzle for injecting the resin adhesive 9 to be inserted into the case 7. Therefore, the resin adhesive 9 can be injected from the bottom of the case 7, thereby making it possible to improve productivity and reduce costs.

Since a tapered portion is formed in the uneven portion 6b of the base 6, the generation of a void can be suppressed when the resin adhesive 9 is injected, thereby improving the reliability of the apparatus.

Further, since the recess 7b for preventing the leakage of the resin adhesive 9 is formed in the opening portion 7a of the case 7 and the cut-out 7c is formed between the recess 7b and the opening portion 7a, even when the resin adhesive 9 overflows, the overflowing resin adhesive 9 is stored in the recess 7b and does not adhere to the side surface of the case 7, thereby improving productivity and reducing costs.

Since an area devoid of a molding resin is between a portion where the magnet 2 is formed and a portion where the MR element 1 is formed in the base 6, the MR element 1 can be arranged in front of the magnet 2 easily by bending. Therefore, productivity can be improved and costs can be reduced.

Since the land portion 5a for mounting the electronic parts of the lead frame 5 is made double-structured, solder does not flow into a portion other than a necessary portion, thereby improving reliability.

In this Embodiment 1, the MR element is used as a magnetic detection element for detecting a magnetic field. It is needless to say that a Hall element or a huge magnetic resistance element may be used as the magnetic detection element.

Embodiment 2

Figure 6:
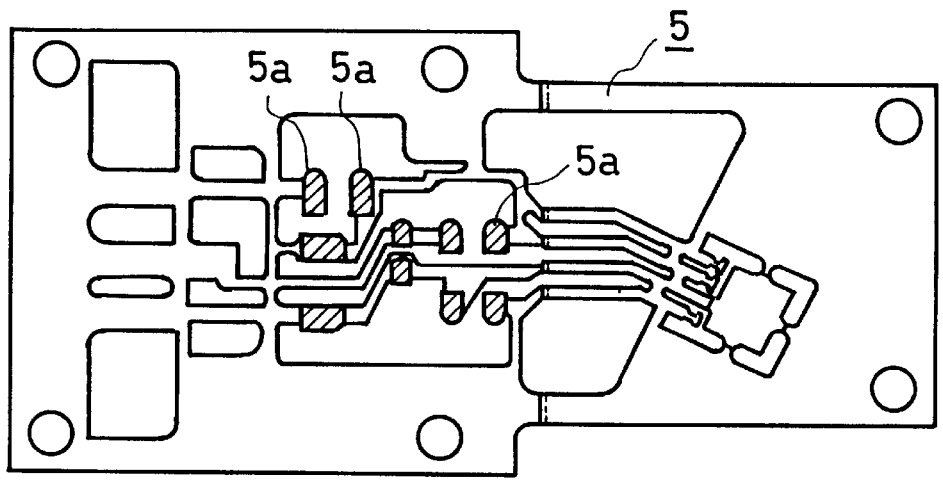
FIG. 6 is a diagram of a lead frame according to Embodiment 2 of the present invention.

In the above Embodiment 1, the land portion 5a of the lead frame 5 for mounting the electronic parts 3 is made double-structured to improve the reliability of the soldered portions of the electronic parts 3. As shown in FIG. 6, only the land portion 5a is plated to improve solderability. As shown in FIG. 6, the same effect can be obtained by plating only the land portion 5a with a metal having high solderability.

The material forming the lead frame 5 is generally copper, iron or iron-nickel alloy. In this Embodiment 2, since the electronic parts 3 are firmly attached to the land portion 5a by plating the land portion 5a with gold or silver having high solderability, the solder does not flow into an area other than the land portion 5a.

In this Embodiment 2, since only the land portion 5a of the lead frame 5 for mounting the electronic parts 3 is plated with a metal having high solderability, solder does not flow into a portion other than a necessary portion, thereby improving reliability. Further, since an additional land portion (bent portion 5b) does not need to be formed on the lead frame 5 unlike the above Embodiment 1, the magnetic detector can be further reduced in size.

In this Embodiment 2, only the land portion 5a is plated with a metal having high solderability. However, the above metal may be adhered to the land portion 5a by a vapor deposition method, sputtering method or the like.

Embodiment 3

Figure 7:
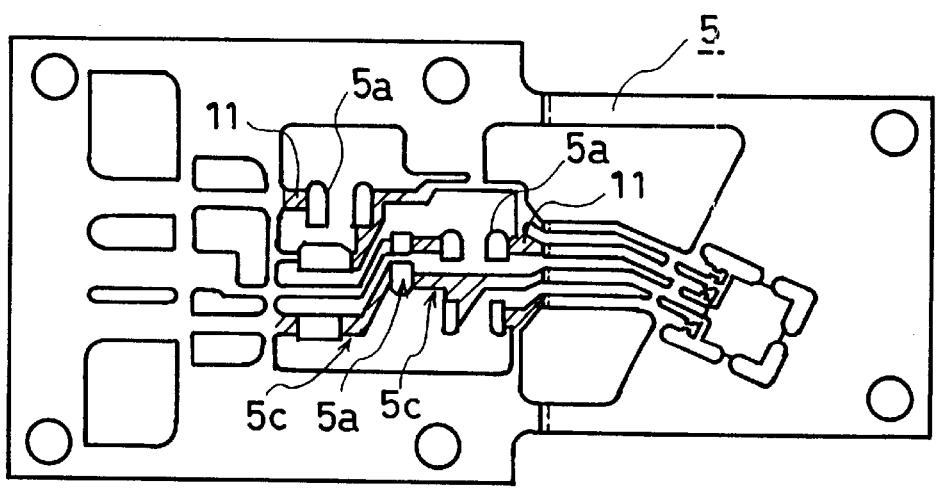
FIG. 7 is a diagram of a lead frame according to Embodiment 3 of the present invention.

In the above Embodiment 2, a metal having high solderability is adhered to only the land portion 5a. As shown in FIG. 7, the same effect can be obtained by coating a resist material 11 to a peripheral portion 5c of the land portion 5a to prevent the solder from flowing away. That is, in this Embodiment 3, the resist material 11 is coated on the peripheral portion 5c of the land portion 5a of the lead frame 5 to prevent solder from flowing into a portion other than a necessary portion.

The same effect can be obtained by plating the peripheral portion 5c of the land portion 5a with nickel or aluminum having lower solder wettability than gold or silver which is the material forming the land portion 5a to form an area having low solder wettability using a material other than the above resist material 11.

As described above, according to the first aspect of the present invention, since the magnetic detection element and the connector are electrically interconnected after the base and the connector are produced as separate units, the shape of the connector can be simplified and the connector can be produced using an inexpensive mold having a simple shape.

According to the second aspect of the present invention, the base for holding the magnetic detection element for detecting a magnetic field and the connector, having a connection portion with the base, for outputting the output signal of the magnetic detection element to the outside are electrically interconnected at the connection portion, the connector can be produced using an inexpensive mold having a simple shape and a low-cost magnetic detector having high productivity can be obtained.

According to the third aspect of the present invention, since the magnetic detection element is protected from moisture, dust and the like by injecting a thermosetting resin into the case without coating liquid packing, it is possible to improve productivity and reduce costs.

According to the fourth aspect of the present invention, since a cut-out portion or through hole is formed in the press-in portion of the base, a resin can be injected into the case easily.

According to the fifth aspect of the present invention, since a tapered portion is formed in the uneven portion of the base, air in the case is escaped easily when the resin is injected, thereby making it possible to suppress the generation of a void.

According to the sixth aspect of the present invention, since a recess is formed near the opening portion of the case, it is possible to prevent the injected resin from leaking to the outside of the case.

According to the seventh aspect of the present invention, since a cut-out is formed between the opening portion of the case and the recess, it is possible to prevent the leakage of the resin without fail.

According to the eighth aspect of the present invention, since the base is constructed such that the resin forming the base does not exist between the magnetic detection element and the output terminal of the magnetic detection element, the operation of soldering the magnetic detection element to the lead frame after the molding of the base is eliminated, and the magnetic detection element can be arranged at a predetermined position easily by bending the output terminal portion of the magnetic detection element, thereby making it possible to improve productivity and reduce costs.

According to the ninth aspect of the present invention, since the land portion is made double-structured by forming a bent portion connected to the land portion and placing it upon the land portion, it is possible to prevent the solder of the electronic parts from flowing to the outside of the land portion. Therefore, the reliability of the apparatus can be improved.

According to the tenth aspect of the present invention, since a metal having high solder wettability is adhered to the land portion of the lead frame, the electronic parts can be firmly fixed to the land portion, thereby making it possible to improve the reliability of the apparatus.

According to the eleventh aspect of the present invention, since an area having lower solder wettability than the land portion is formed around the land portion of the lead frame, it is possible to prevent the solder of the electronic parts from flowing to the outside of the land portion. Therefore, the reliability of the apparatus can be improved.

According to the twelfth aspect of the present invention, since the area having low solder wettabilty is formed by a resist material, it is possible to prevent the solder of the electronic parts from flowing to the outside of the land portion.

What is claimed is:

1. A magnetic detector comprising:

a base for holding a magnetic detection element for detecting a magnetic field, the base comprising:

a cut-out portion or a through hole formed in a press-in portion of the base for injecting a resin; and a tapered portion at an end of the base;

a case for housing the base, comprising a press-in hole for press fitting the base; and a connector, produced as a separate unit from the base and having a connection portion connected to the base, for outputting an output signal of the magnetic detection element to the outside, wherein the resin is injected into the case, and the tapered portion of the base is near an opening of the case through which the base is inserted.

2. The magnetic detector of claim 1, wherein a recess is formed near an opening portion of the case.

3. The magnetic detector of claim 2, wherein a cut-out is formed between the opening portion of the case and the recess.

4. The magnetic detector of claim 1, wherein the base is constructed such that a resin forming the base does not exist between the magnetic detection element and an output terminal of the magnetic detection element.

5. A magnetic detector of claim 1 further comprising electronic parts for processing the output signal of the magnetic detection element and a lead frame, connected to the connector, for mounting these electronic parts, and characterized in that a bent portion of the lead frame connected adjacent to a land portion of the lead frame, upon which one of the electronic parts is mounted, is bent over onto the land portion.

6. A magnetic detector of claim 1 further comprising electronic parts for processing the output signal of the magnetic detection element and a lead frame, connected to the connector, for mounting the electronic parts, and characterized in that a metal having a high solder wettability is adhered to a land portion of the lead frame, upon which one of the electronic parts is mounted.

7. A magnetic detector of claim 1 further comprising electronic parts for processing the output signal of the magnetic detection element and a lead frame, connected to the connector, for mounting the electronic parts, and characterized in that an area having lower solder wettability than the land portion is formed around a land portion of the lead frame, wherein one of the electronic parts is mounted to the land portion.

8. The magnetic detector of claim 7, wherein the area having low solder wettability is formed by a resist material.

* * * * *